United States Patent
Haaheim et al.

(10) Patent No.: US 8,017,191 B2
(45) Date of Patent: Sep. 13, 2011

(54) FAST DIP FOR REDUCED WICKING IN NANOLITHOGRAHIC INK DELIVERY

(75) Inventors: Jason Haaheim, Chicago, IL (US); Gregory Athas, Lisle, IL (US)

(73) Assignee: Nanoink, Inc., Skokie, IL (US)

( * ) Notice: Subject to any disclaimer, the term of this patent is extended or adjusted under 35 U.S.C. 154(b) by 959 days.

(21) Appl. No.: 11/848,215

(22) Filed: Aug. 30, 2007

(65) Prior Publication Data

US 2008/0055344 A1 Mar. 6, 2008

Related U.S. Application Data

(60) Provisional application No. 60/841,209, filed on Aug. 31, 2006.

(51) Int. Cl.
 *B05D 1/18* (2006.01)
(52) U.S. Cl. .................................... 427/430.1
(58) Field of Classification Search ............... 427/430.1
 See application file for complete search history.

(56) References Cited

U.S. PATENT DOCUMENTS

| | | | |
|---|---|---|---|
| 6,642,179 B2 | 11/2003 | Watschke | |
| 6,827,979 B2 * | 12/2004 | Mirkin et al. | 427/256 |
| 7,005,378 B2 | 2/2006 | Crocker et al. | |
| 7,034,854 B2 | 4/2006 | Cruchon-Dupeyrat et al. | |
| 7,060,977 B1 * | 6/2006 | Dupeyrat et al. | 250/306 |
| 7,081,624 B2 | 7/2006 | Liu et al. | |
| 7,279,046 B2 | 10/2007 | Eby | |
| 2005/0035983 A1 * | 2/2005 | Cruchon-Dupeyrat et al. | 346/140.1 |
| 2008/0105042 A1 | 5/2008 | Mirkin | |

OTHER PUBLICATIONS

Zhang et al. Passive and Active Probe Arrays for Dip-Pen Nanolithography. S1.2 Nanolithography, IEEE-Nano 2001. Oct. 28, 2001.*
Derwent Abstract of WO 2004-449564.*
U.S. Appl. No. 60/792,950, filed Apr. 19, 2006, Mirkin.
U.S. Appl. No. 60/894,657, filed Mar. 13, 2007, Haaheim.

* cited by examiner

*Primary Examiner* — David Turocy
(74) *Attorney, Agent, or Firm* — Foley & Lardner LLP

(57) ABSTRACT

A method of dipping a nanoscopic probe comprising dipping a nanoscopic tip at a dipping rate into an inkwell comprising ink, wherein the dipping rate is configured to be sufficiently faster than a rate of wicking. A nanoscopic probe comprising a nanoscopic tip and an inkwell configured to contain ink, wherein the nanoscopic probe is configured to dip into and retract from the ink at a rate that is sufficiently faster than wicking. Wicking can cause excessive amounts of ink to be deposited on nanoscopic tips, which can lead to contamination of inkwells and other nanoscopic tips.

13 Claims, 4 Drawing Sheets

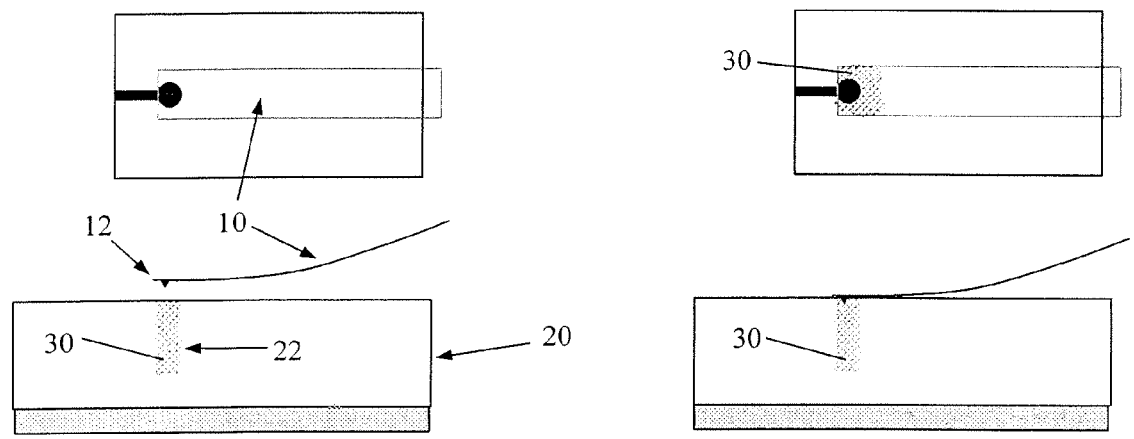
Figure 1a
Prior Art
Figure 1b
Prior Art
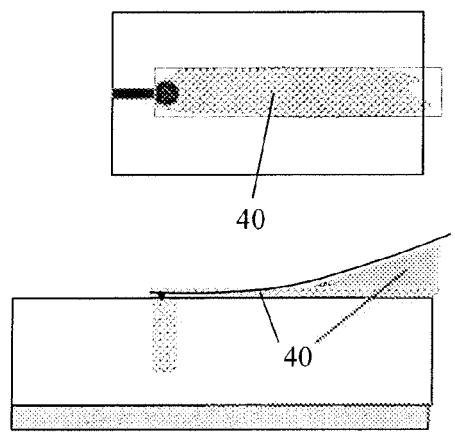
Figure 1c
Prior Art

FAST DIP FOR REDUCED WICKING IN NANOLITHOGRAHIC INK DELIVERY

RELATED APPLICATIONS

This application claims priority to provisional application Ser. No. 60/841,209 filed Aug. 31, 2007, which is hereby incorporated by reference in its entirety.

BACKGROUND

Nanolithographic printing devices, such as those used in direct write processes like cantilever tip-based deposition processes like DPN® printing, can be operated to apply ink to a nanoscopic tip such as an atomic force microscope (AFM) tip by dipping the tip into inkwells. See for example U.S. Pat. No. 6,827,979 to Mirkin; U.S. Pat. No. 6,642,179 to Liu; U.S. Pat. No. 7,081,624 to Liu; U.S. Pat. No. 7,005,378 to Crocker, regarding printing and U.S. Pat. No. 7,034,854 regarding inkwells. When dipping, it is often necessary to accomplish selective ink delivery to nanoscopic tips without contaminating surrounding tips when using arrays of multiple nanoscopic tips. Also, the ink should coat only the underside of the cantilever, and ink from one inkwell should not migrate to another ink well. Furthermore, conventional nanolithographic printing devices are typically operated so that the nanoscopic tip approaches an inkwell in slow iterations of movement, causing the dipping time for the tip to be extended. Such movements of the nanoscopic tip can be made manually by an operator, which further increases the dipping time. For example, a nanoscopic tip can be manually controlled until the tip is within 2-5 µm of the inkwell surface. Hence, nanoscale dipping can be a complicated process which can require slow processes to be careful. Conventional wisdom would be that one does not want to operate too quickly so high quality can be maintained.

A problem that can occur with conventional nanolithographic printing devices is the wicking of ink. Wicking can occur when ink spreads along the tip, cantilever, and probe of a nanolithographic printing device. This causes an excessive amount of ink to be deposited upon the probe and can lead to contamination. For example, wicking can cause contamination of other probes and inkwells.

FIGS. 1a-1c show wicking during various stages of dipping for a conventional nanolithographic printing device. FIG. 1a is a top and side view of a conventional nanolithographic printing device in which a probe 10 has been positioned above an inkwell 20 so that the tip 12 of the probe 10 can be dipped into the microwell 22, which contains ink 30.

FIG. 1b is a top and side view of the nanolithographic printing device during an initial phase of dipping the probe tip 12 into the microwell 22. In this phase some wicking has occurred, as shown by the area of ink 30 illustrated in the top view of FIG. 1b. Wicking occurs while the probe 10 is dipped into the inkwell 20, allowing ink 30 to spread along the probe 10 and the upper surface of the inkwell 20.

FIG. 1c is a top and side view of the nanolithographic printing device during a later stage in dipping. Wicking has progressed to an advanced degree, as illustrated by the wicking areas 40. As the probe 10 is dipped and allowed to remain in the inkwell 20, wicking can progress, causing ink 30 to flow along the probe 10 and the upper surface of the inkwell 20.

SUMMARY

Provided herein are methods of operation as well as computer software to execute these methods on instrumentation.

One embodiment provides a method of dipping a nanoscopic probe comprising the steps of: (i) dipping a nanoscopic tip at a dipping rate into an inkwell comprising ink, (ii) retracting the nanoscopic tip at a retraction rate, (iii) wherein the dipping rate and the retraction rate are sufficiently fast to reduce the amount of ink wicking.

Another embodiment provided a method of dipping a nanoscopic probe comprising the steps of: dipping a nanoscopic tip at a dipping rate into an inkwell comprising ink, wherein the rate of dipping is at least 10 microns/second, retracting the nanoscopic tip at a retraction rate, wherein the retraction rate is at least 10 microns/second.

Another embodiment provides a computer readable medium comprising: a program code recorded therein which, when executed on a computer system, causes the computer system to perform the step of dipping a nanoscopic tip at a dipping rate into an inkwell comprising ink, retracting the tip from the inkwell, wherein the dipping rate and retraction rate are configured to be sufficiently faster than a rate of wicking.

Advantages include better printing, including higher resolution and more reproducibility, and less wicking. This is particularly important when for example the inkwells comprise hydrophilic surfaces and the ink solutions are made more hydrophobic, and want to leave the inkwell. Unexpectedly, fast rates of dipping did not prevent large amounts of ink being transferred from inkwell to tip. In particular, an advantage is selective microfluidic ink delivery to individual cantilever tips without further cantilever contamination, and/or cantilever-to-cantilever contamination, and/or cross-contamination between inkwells.

BRIEF DESCRIPTION OF THE DRAWINGS

FIG. 1a is a top and side view of a nanolithographic printing device in which a probe has been positioned above an inkwell for dipping.

FIG. 1b is a top and side view of a nanolithographic printing device during an initial phase of dipping in which some wicking has occurred.

FIG. 1c is a top and side view of a nanolithographic printing device during dipping in which wicking has progressed to an advanced degree.

DETAILED DESCRIPTION

U.S. Pat. No. 6,827,979 to Mirkin; U.S. Pat. No. 6,642,179 to Liu; U.S. Pat. No. 7,081,624 to Liu; U.S. Pat. No. 7,005,378 to Crocker, regarding printing and U.S. Pat. No. 7,034,854 regarding inkwells can be used in the practice of the presently described embodiments. Calibration and alignment methods can be used as described in for example U.S. Pat. No. 7,060,977 to Cruchon-Dupeyrat et al. and 2003/0185967 to Eby et al. Instruments, software, and accessories can be obtained from NanoInk, Inc. (Chicago, Ill.).

An object of the embodiments described herein is to minimize or prevent wicking during dipping of a nanolithographic printing device. According to an embodiment, wicking is minimized by performing a fast dip of the nanolithographic printing device into the inkwell. The following embodiments can be used with nanolithographic printing devices employing a single probe, a one-dimensional array of probes, two dimensional arrays of probes, or other probe arrangements. U.S. patent application No. 60/792,950 filed Apr. 19, 2006; Ser. No. 11/690,738 filed Mar. 23, 2007; and 60/894,657 filed Mar. 13, 2007 describe two dimensional arrays of cantilevers and tips and are each hereby incorporated by reference in its entirety.

Figure 2:
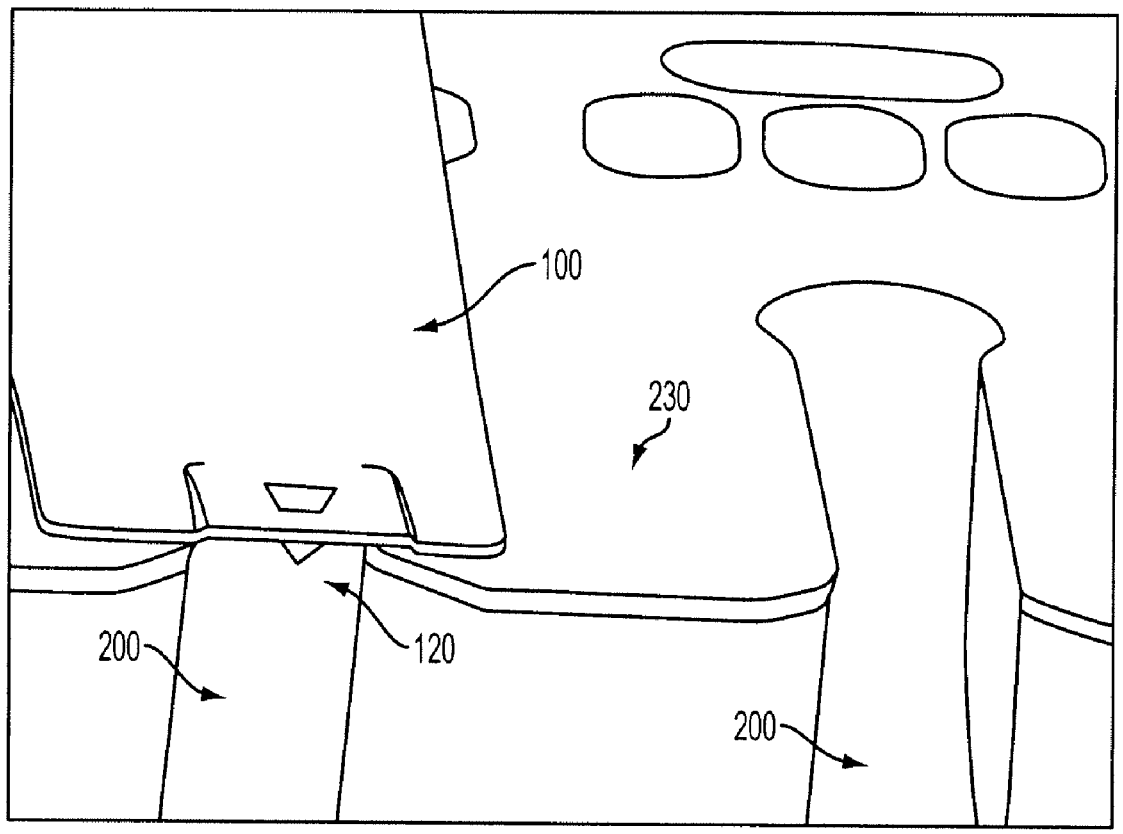
FIG. 2 is a photograph of an inkwell for dipping of a nanolithographic printing device.

FIG. 2 is a photograph of inkwells 200 for dipping of a nanoscopic probe 100 and tip 120. As shown in FIG. 2, the inkwells 200 have a flat top surface 230, which increases the likelihood that wicking will occur along the top surface of the inkwell. Furthermore, because the top surface 230 is common or shared by adjacent inkwells 200, there is an increased likelihood of cross-contamination of the inkwells 200 due to wicking of ink between the inkwells 200.

Figure 3:
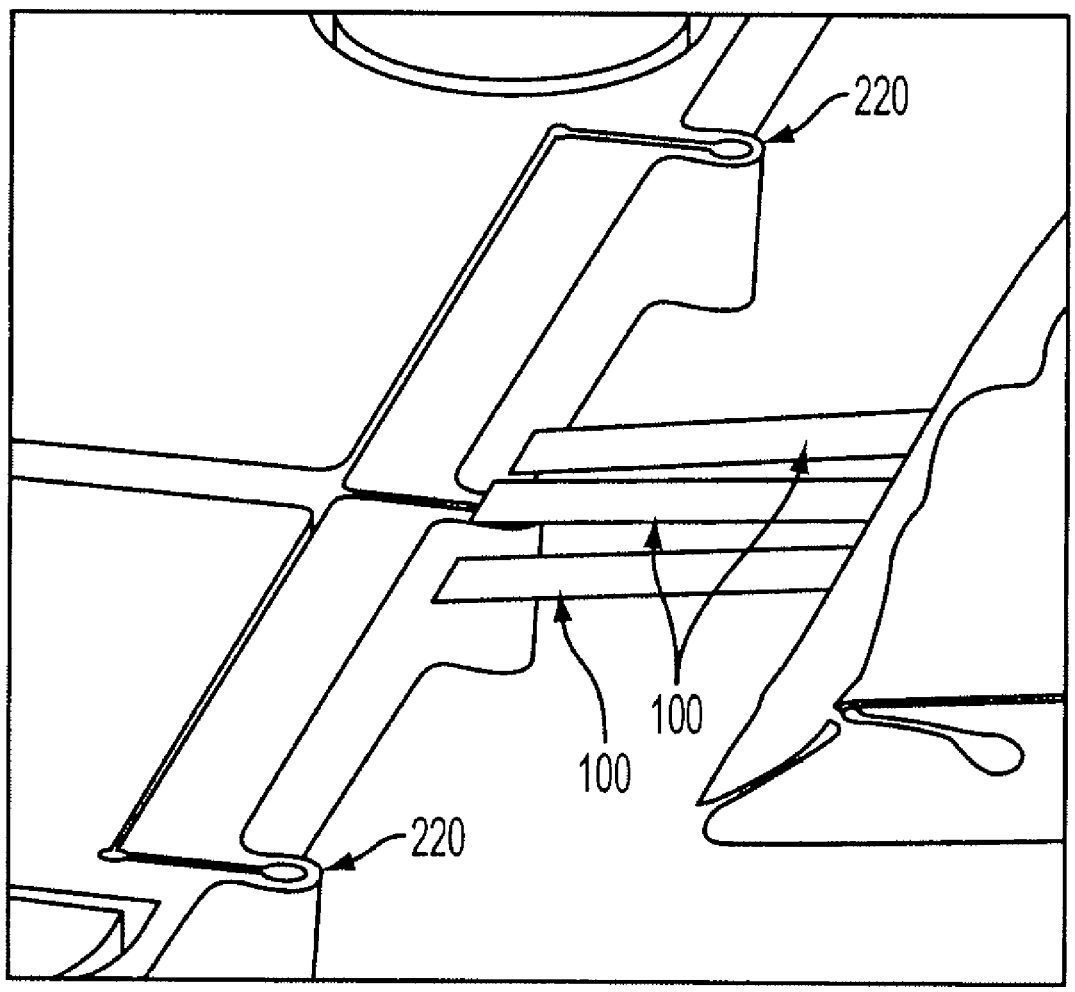
FIG. 3 is a photograph of an inkwell for dipping of a nanolithographic printing device, in which microwells are laterally isolated.

FIG. 3 is a photograph of an inkwell design in which inkwell microwells 200 are laterally isolated from one another. The microwells 220 can be laterally isolated by, for example, vertically etching the microwells 220 or using other methods known in the art to create the structure shown in FIG. 3. Because the design shown in FIG. 3 lack a common top surface between the microwells 220, the likelihood of cross-contamination is reduced. The inkwell can also be vertically etched under the area where the probes 100 are aligned for dipping, which reduces the likelihood of wicking along the underside of probes 100. However, wicking along DPN probes 100 can still occur with the inkwell design shown in FIG. 3.

Inkwells are adapted to be used with inks. Ink compositions can comprise one or more solvents as well as materials designed to be patterned onto surfaces. However, inkwells can also comprise mere solvents useful in for example washing tips.

According to an embodiment, a fast dip process is provided to minimize or prevent wicking of ink on a nanoscopic probe. Such a process can be performed by rapidly dipping the nanoscopic probe. According to an embodiment, the probe remains in contact with the inkwell for a small amount of time, thereby minimizing the amount of ink that spreads along the probe and/or surface of the inkwell. By using the fast dip process a sufficient amount of ink can be applied to a nanoscopic probe tip while minimizing or preventing wicking. According to a further embodiment, the probe has substantially no dwell time in the ink.

According to an embodiment, a fast dip process is provided in which the rate of dipping is configured to be sufficiently fast so that dipping of a nanoscopic tip is faster than the rate of wicking. For example, the rate of dipping a nanoscopic tip can be greater than the rate of wicking. In a further example, the rate of retracting a nanoscopic tip can be greater than the rate of wicking, thereby minimizing or preventing wicking on a nanoscopic probe.

According to a further embodiment, a fast dip process is provided that comprises the step of aligning a nanoscopic probe above an inkwell surface. This position can be referred to as the 0 μm position along the z axis, or vertical axis, during the dipping operation. For example, the probe can be aligned so that the probe tip is about approximately 1-10 μm, or more particularly approximately 2-5 μm, above the inkwell surface to set the 0 μm position. One can first seek out general alignment near the inkwell rather than at the inkwell itself, and then laterally move over to the inkwell. If one is too close to the inkwell, the tip can be sucked into the inkwell by capillary. If one is too far from the inkwell, the dipping step will not result in wetting of the tip.

Next, the nanoscopic probe is lowered toward the upper surface of the inkwell so that the tip of the nanoscopic probe contacts a microwell of the inkwell. The probe can be lowered by an amount that is greater than the distance between the probe and inkwell surface in order to ensure that the probe tip comes into contact with the microwell and dipping occurs. For example, the probe can be lowered by approximately 5-15 μm, or more particularly approximately 7-10 μm. In relation to the 0 μm position, this step lowers the probe by a negative distance. For example, the probe can be lowered by approximately −5-15 μm, or more particularly approximately −7-10 μm. The lowering amount can be determined by the full range of the piezo electric motors than control positioning of the cantilevers.

When the nanoscopic probe is lowered to initiate dipping, the probe remains in contact with the ink contained in the inkwell for a very short time to minimize or prevent wicking. According to a further embodiment, the probe has substantially no dwell time in the ink. For example, the probe may be lowered so that the probe contacts the ink and then be immediately retracted so that the probe does not remain in contact with ink. In this fashion, there is essentially no time for ink to wick and spread along the probe and/or surfaces of the inkwell. Therefore, wicking, contamination of inkwell surfaces, and contamination of other probes in an array are minimized or prevented.

When the nanoscopic probe is retracted it can be returned to the same position before fast dipping commenced, such as the 0 μm position. According to an embodiment, the steps of lowering and retracting the probe can occur in a total time of less than approximately 0.10 seconds from start to finish, or more particularly less than approximately 0.07 seconds, or more particularly less than approximately 0.05 seconds, or more particularly less than approximately 0.03 seconds. After the fast dip operation is complete, the probe can be withdrawn to a distance further away from the inkwell in preparation for use in a nanolithographic printing process.

Figure 4A:
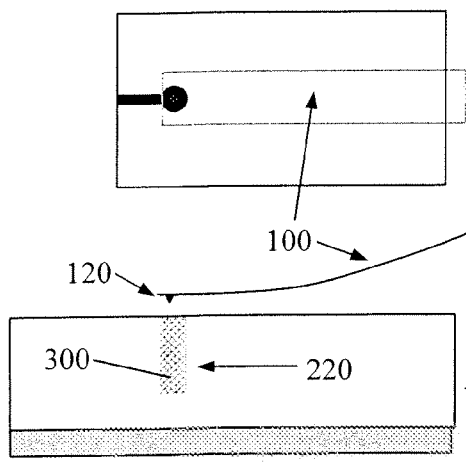
FIG. 4a is a top and side view of a nanolithographic printing device in which a probe has been positioned above an inkwell for dipping, according to an embodiment.
Figure 4B:
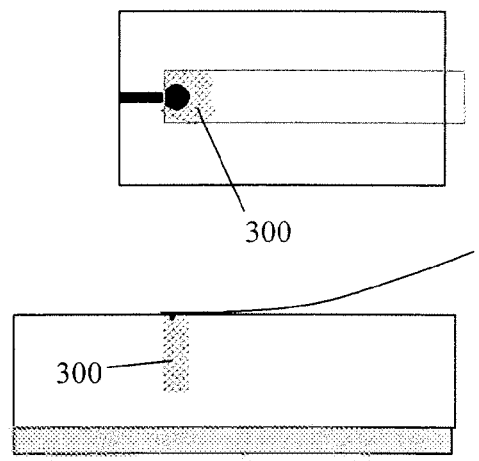
FIG. 4b is a top and side view of a nanolithographic printing device during an initial phase of dipping, according to an embodiment.
Figure 4C:
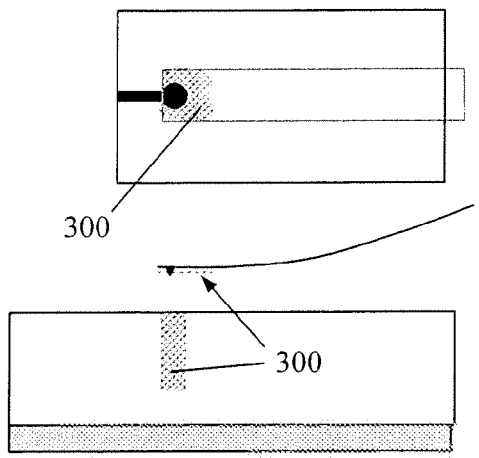
FIG. 4c is a top and side view of a nanolithographic printing device after the probe has been retracted from the inkwell, according to an embodiment.

FIGS. 4a-4c illustrate a fast dip process, according to an embodiment. FIG. 4a shows a top view and a side view of a nanoscopic device in which a probe 100 has been positioned above an inkwell 200 so that the probe tip 120 can be dipped into the microwell 220 of the inkwell 200, which contains ink 300. FIG. 4b shows a top view and side view of the nanoscopic device at the instant that the probe 100 comes into contact with the ink 300 in the microwell 220, permitting ink 300 to be deposited onto the tip 120 of the probe 100. As shown in the top view of FIG. 4b, a limited amount of wicking can occur during fast dipping. However, process parameters, such as, for example, dip speed or dwell time, can be adjusted to further minimize or prevent wicking.

FIG. 4c shows a top view and side view of the nanoscopic device after the fast dip operation is complete. As shown in FIG. 4c, ink 300 has been applied to the tip 120 of the probe 100 with a minimal amount of wicking so that ink has not spread along the probe 100 and/or the top surface of the inkwell 200. As noted above, process parameters can be adjusted to further minimized or prevent wicking.

According to an embodiment, the fast dip process can be controlled so that the dip speed can be adjusted. For example, the process can be controlled so that the dip speed can occur in more or less total time. Such a control can be used to adjust the amount of dwell time, if any, for a probe when it is dipped into an inkwell.

The process embodiments described above can be implemented with a nanoscopic probe that can be operated in passive or active mode. Thermal DPN pens and tips can be used. When the nanoscopic probe is operated in passive mode the cantilevered probe remains relatively stiff and is not designed for actuation. When the nanoscopic probe is operated in active mode the cantilevered probe is configured to deflect in the vertical direction, causing the tip to move upwards and downwards along the z axis, and be actuated. According to an embodiment, a nanoscopic probe can perform a fast dip process when the probe is in passive mode.

According to an embodiment, a nanolithographic printing apparatus is provided that is configured to apply ink to the nanoscopic probe with a fast dip, thereby minimizing or preventing wicking. Such a nanolithographic printing apparatus can be configured to perform any of the fast dip process embodiments discussed above. For example, a nanolithographic printing apparatus can include a control system that is configured to perform a fast dip of a nanoscopic tip.

The dipping rate and the retraction rate can be substantially the same (e.g., within 10% of each other). The rates can be for example at least 10 microns per second, or at least 50 microns/second, or at least 100 microns per second, or at least 200 microns per second, or at least 350 microns/second, or at least 400 microns per second. Video methods can be used to determine dipping rate.

According to an embodiment, a computer readable medium having program code recorded therein is provided, when executed on a computer system or control system for a nanolithographic printing device, causes the computer system or control system to perform any of the fast dip process embodiments described above.

All references cited herein are hereby incorporated by reference in their entirety.

What is claimed is:

1. A method of dipping a nanoscopic probe comprising the steps of:
    dipping a nanoscopic tip at a dipping rate into an inkwell comprising ink, wherein the rate of dipping is at least 10 microns/second,
    refracting the nanoscopic tip at a refraction rate, wherein the retraction rate is at least 10 microns/second,
    wherein the nanoscopic tip is retracted immediately after the nanoscopic tip is dipped into the inkwell.

2. A method according to claim 1, wherein the dipping rate and the refraction rate are each at least 350 microns/second.

3. A method according to claim 1, wherein the dipping rate and the refraction rate are substantially the same.

4. A method according to claim 1, wherein the dipping rate and the retraction rate are within 10% of each other.

5. The method according to claim 1, wherein the dipping rate and the retraction rate are sufficiently fast to reduce the amount of ink wicking.

6. The method according to claim 1, wherein the dipping rate and the retraction rate are faster than the rate of wicking.

7. A non-transitory computer readable medium comprising:
    a program code recorded therein which, when executed on a computer system, causes the computer system to perform the step of dipping a nanoscopic tip at a dipping rate into an inkwell comprising ink, retracting the tip from the inkwell at a retraction rate, wherein the dipping rate is at least 10 microns/second and the retraction rate is at least 10 microns/second, and wherein the nanoscopic tip is retracted immediately after the nanoscopic tip is dipped into the inkwell.

8. The non-transitory computer readable medium of claim 7, wherein the dipping rate and the retraction rate are substantially the same.

9. The non-transitory computer readable medium of claim 7, wherein the dipping rate and the retraction rate are within 10% of each other.

10. The non-transitory computer readable medium of claim 7, wherein the nanoscopic tip is dipped and retracted so that the nanoscopic tip has substantially no dwell time in the ink.

11. The non-transitory computer readable medium of claim 7, wherein the step of dipping is performed with a passive probe.

12. The non-transitory computer readable medium of claim 7, wherein the step of dipping is performed with an active probe.

13. The non-transitory computer readable medium of claim 7, wherein the step of dipping is performed with a one-dimensional or two-dimensional array of probes.

* * * * *